United States Patent [19]

Poduje

[11] 3,986,109
[45] Oct. 12, 1976

[54] SELF-CALIBRATING DIMENSION GAUGE

[75] Inventor: Noel S. Poduje, Needham Heights, Mass.

[73] Assignee: ADE Corporation, Watertown, Mass.

[22] Filed: Jan. 29, 1975

[21] Appl. No.: 545,111

[52] U.S. Cl. .............................. 324/61 R; 324/61 P
[51] Int. Cl.² .......................................... G01R 27/26
[58] Field of Search ............. 324/61 R, 60 C, 60 R, 324/61 P, DIG. 1; 317/246

[56] References Cited
UNITED STATES PATENTS

| | | | |
|---|---|---|---|
| 3,353,098 | 11/1967 | Foster et al. | 324/61 R X |
| 3,379,972 | 4/1968 | Foster et al. | 324/61 R |
| 3,387,776 | 6/1968 | Stillwell et al. | 324/61 R |
| 3,452,273 | 6/1969 | Foster | 324/61 R |
| 3,487,300 | 12/1969 | Merrell | 324/60 R |
| 3,761,810 | 9/1973 | Fathauer | 324/61 R |
| 3,775,678 | 11/1973 | Abbe | 324/DIG. 1 X |

Primary Examiner—Stanley T. Krawczewicz
Attorney, Agent, or Firm—Weingarten, Maxham & Schurgin

[57] ABSTRACT

A self-calibration system for use with a dimension-measuring probe. The self-calibration system includes a probe fixture which permits alternative orientation of the probe toward the work piece being gauged, or toward a readily available reference such as free space and a dimension reference typically of virtual infinite size. A closed loop feedback circuit is provided to develop a compensating signal for combination with the probe output to yield a dimension representing signal. The compensating signal is automatically set with the probe oriented toward the reference dimension to cause the dimension representing signal to correspond to a known value. Thereafter, the compensating signal is held constant and gauging of work piece dimensions can continue with system errors eliminated by the compensating signal.

12 Claims, 5 Drawing Figures

SELF-CALIBRATING DIMENSION GAUGE

FIELD OF THE INVENTION

The present invention relates to a dimension-gauging system and more particularly to an improved method and apparatus for compensation of system errors caused by gradual changes in the system or its environment.

BACKGROUND OF THE INVENTION

As disclosed in U.S. Pat. No. 3,706,919, it is known that dimension-measuring probes may be designed using the known variation of capacitance between conductors with separation to provide a highly accurate and automatic non-contact dimensional or distance gauge which is particularly useful in present day industrial applications. Dimension gauge equipment setup and calibration for surface investigation is a time consuming part of capacitive gauging, but necessary if accuracy is to be maintained. Among the problems of the prior art are gradual changes in probe calibration produced by environmental or circuit effects. These variations cause intolerably large changes in electrical output signals of circuitry operating with the probe despite no variation in the capacitance being sensed. Furthermore, because the relationship between output voltage of the probe and measured distance is nonlinear and linearizing circuitry is often employed, changes in the output of the probe from these effects causes the linearity to also be shifted.

SUMMARY OF THE INVENTION

The present invention provides a method and apparatus for compensating a capacitive dimension-measuring system for system errors introduced by gradual environmental or circuit changes. In the present invention the capacitive probe of a dimension-measuring system is fixtured for alternative orientation toward a work object to gauge the distance to it or away from the work object toward any readily available reference, such as free space and a virtually infinite dimension. For automatic compensation, the probe is periodically directed toward the reference dimension and a compensation signal is combined with the probe output to produce a predetermined combined signal level. The compensation signal is then maintained at that same level during subsequent probe use, insuring a continuing accuracy.

In practicing the invention, a two-state, compensation signal generating circuit is provided in the form of a probe output signal amplifier having a selectively closed feedback loop. In the first state, when the probe is oriented away from the work object and toward free space, or any other suitable reference, the feedback loop is closed around the amplifier to combine with the probe output, the compensating signal developed in the feedback loop. A reference signal in the feedback loop is initially set at a level which causes the amplifier output to correspond to the reference dimension. The feedback loop includes a signal storage element which stores a signal that maintains the compensating signal at this same level in a second state for the circuit to permit probe orientation toward the work object. The constant compensating signal insures gauging accuracy over the range of useful dimensions for intervals of use between resetting of the compensating signal during which the system changes found in capacitive probes can be neglected.

BRIEF DESCRIPTION OF THE DRAWING

The features of this invention will be more clearly understood by referring to the preferred embodiment in the below detailed description in conjunction with the accompanying drawing of which.

DESCRIPTION OF THE PREFERRED EMBODIMENT

Since it is well known that capacitance is an inverse function of the distance between the capacitor plates, a capacitive probe provides an excellent and extremely accurate dimension-measuring system. However, variation in the measured capacitance due to both changes in the environmental conditions and changes in the operating parameters of the internal electronic circuitry of the probe can cause the probe output signal to drift. Since the probe output signal is normally linearized to provide a more convenient output, any drift in sensor output also changes linearity as well as probe accuracy. The present invention provides a method and apparatus for compensating the dimension-gauging capacitive probe for drifts and inaccuracies that may occur in the probe system because of environmental or internal electrical changes in the system.

Figure 1A:
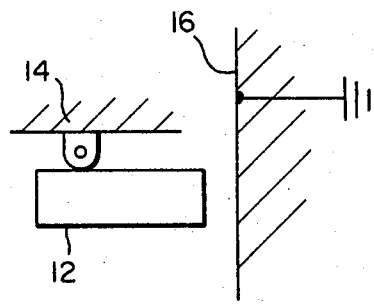
FIG. 1A is a schematic view of a probe oriented toward a work object.
Figure 1B:
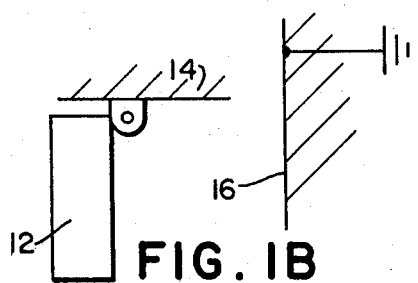
FIG. 1B is a schematic representation of the probe oriented away from the work object.

As shown in FIGS. 1A and 1B, a capacitive probe 12 is fixtured as conceptually indicated by pivot 14 so that it can be oriented either toward (FIG. 1A) or away (FIG. 1B) from a work piece or object 16. The work object 16 is normally a grounded conductor. When the probe 12 is oriented toward free space, or any other available constant reference distance, a predetermined, known probe output voltage level corresponding to that reference distance should be present. Compensating electronics according to the present invention is provided to automatically bias the probe output voltage to achieve this known level in the reference orientation. The compensation thus provided is maintained during subsequent probe gauging to insure continued accuracy.

Figure 2:
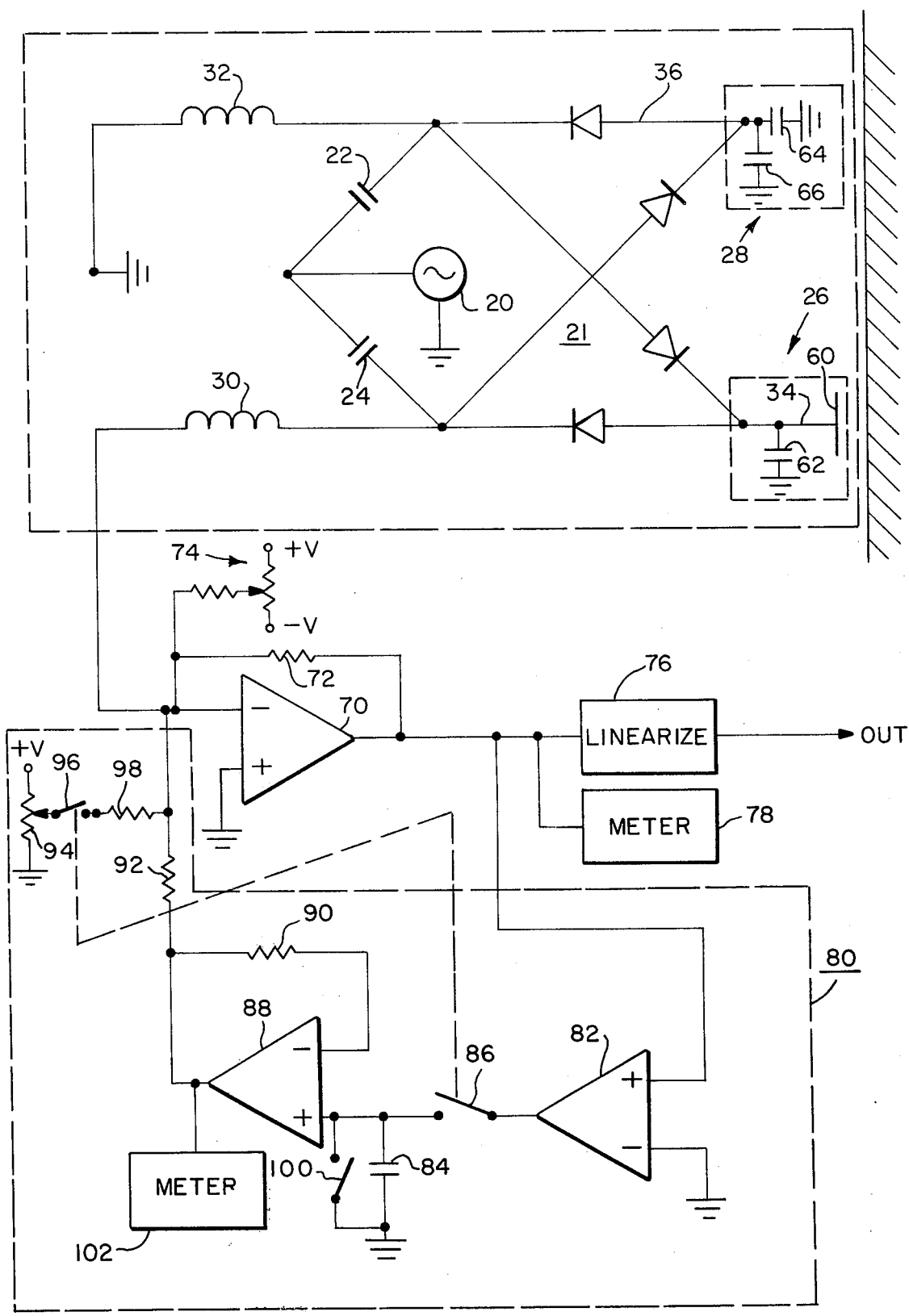
FIG. 2 is a schematic view of the dimension-gauging system of the present invention.

Referring to FIG. 2, circuitry comprising the probe 12 includes an oscillator 20 for applying excitation in parallel to two equal capacitors 22 and 24. A diode matrix 21, formed as a four diode bridge with the diodes oriented for conduction in the same direction, receives on opposite bridge terminals the excitation through each capacitor 22 and 24. The diode bridge supplies excitation from the other opposite terminals to measuring and balancing capacitances 26 and 28. During a first half cycle of given excitation polarity, excitation is conducted from each capacitor 22 and 24 separately to capacitances 26 and 28 respectively, and during the following half cycle of the opposite polarity through capacitors 22 and 24 separately to the opposite capacitances 26 and 28. Over repeated cycles from the oscillator 20 the junctions between capacitors 22 and 24 and bridge matrix 21 will have a DC average signal in addition to an AC component. The level of DC signal indicates the capacitance difference between the two capacitances 26 and 28. The AC component is filtered by inductors 30 and 32 connected from opposite junctions of matrix 21 to produce only a DC signal as the probe output.

Figure 3:
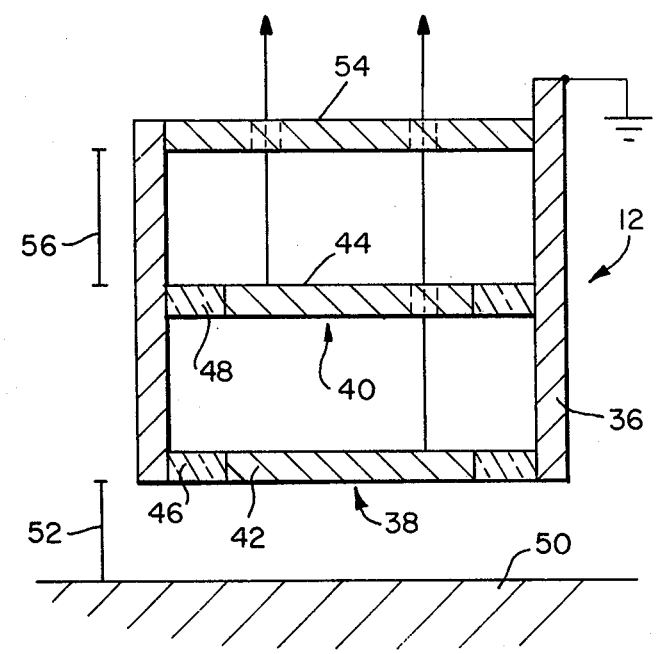
FIG. 3 is a schematic view of a representative probe for use with the system of the present invention.

A preferred physical structure for the probe 12 is shown in FIG. 3 as a sectional view of a part of the probe and is a prior art modification of the probe shown in the above U.S. Pat. No. 3,706,919 incorporated herein by reference. The probe 12 includes a conducting, typically cylindrical, grounded housing 36 enclosing front and rear, planar electrode assemblies 38 and 40. Assemblies 38 and 40 each comprise inner conductive discs 42 and 44 respectively and surrounding dielectric annuli 46 and 48 respectively. Annuli 46 and 48 concentrically position and secure the discs 42 and 44 within housing 36. Assembly 38 will generally be flush with one end of housing 36 in order to provide a capacitance between disc 42 and a work object 50 which is to be detected as an indication of the distance 52 between the probe and work object 50. A further, grounded conductive disc 54 is secured within housing 36 a distance 56 rearward of the assembly 40 to provide an additional capacitance between the electrode 44 and housing 36. Preferably, the distance 56 is made similar to the maximum distance 52 within the probe measurement range in order to produce a zero probe output signal level output as this maximum distance. This capacitive biasing of the probe eliminates undesired high signal levels in the system which can be a source of error and must normally be electrically offset at some point in the gauging system.

Returning to FIG. 2, the probe capacitances 26 and 28 are shown to include individual capacitors reflecting the various sources of capacitance between the electrodes 42 and 44 and ground. In particular, capacitors 60 and 62 represent the capacitance between electrode 42 and respectively the object 50 and housing 36 while capacitors 64 and 66 represent the capacitance between electrode 44 and respectively the disc 54 and housing 36.

As shown in FIG. 2, an output of the probe 12 from inductor 30 is applied to a current summing and inverting input of an amplifier 70. The amplifier 70 includes a feedback resistor 72 to define amplifier gain and has a further current input from a variable reference source 74 which permits a fine adjustment in the signal level from the probe 12 for accurately zeroing this signal at the maximum distance 52. A linearizer 76, preferably using a diode break point approximation network, receives the output of amplifier 70 to linearize the relationship between output signal level and gauged distance. A meter 78 responds to the output of amplifier 70 (or linearizer 76) for indicating the gauged dimension and may be used to facilitate the setting of controls described below.

Automatic compensation in the signal applied to the linearizer 76 from amplifier 70 is provided by a feedback system 80 for amplifier 70. The composite signal from amplifier 70 is applied within feedback system 80 to a non-inverting input of a high gain difference amplifier 82. Difference amplifier 82 receives a reference signal on an inverting input, in this case, the reference signal is at ground potential.

The output of the amplifier 82 is selectively applied to a storage capacitor 84 through a switch 86 when closed. The stored output is applied to a non-inverting input of a buffer amplifier 88 having a gain determining resistor 90 in a feedback path. Amplifier 88 has an input impedance that, in combination with the storage capacitor 84, provides a long time constant compared to the interval for use of the probe system without recalibration. The output of amplifier 88 is applied through a current limiting resistor 92 to the current summing input of amplifier 70. A reference source 94 also provides a reference current input to amplifier 70 through a switch 96 and current limiting resistor 98. For initial system calibration, a switch 100 is provided to ground the input of amplifier 88 and a meter 102 may be connected to monitor the output of amplifier 88.

For initial calibrating, the switch 100 is closed and the reference voltage 74 is adjusted to cause the output of amplifier 70 to be zero for the selected maximum distance 52. Then, probe 12 is oriented away from work object 50 and pointed toward free space or any other suitable reference distance preferably much greater than the maximum distance 52 to reduce the sensitivity to errors. Variable reference voltage source 94 is then adjusted with switch 100 open and switches 86 and 96 closed so that meter 102 indicates a zero output value. The feedback loop insures that the output of amplifier 70 will also be zero. Thus, reference source 94 shifts the system zero point with switch 96 closed to the reference distance, maintaining the output of amplifier 88 at zero. Some signal will be stored in capacitor 84 to insure this condition is satisfied. The signal on capacitor 84 continues to provide a compensation in the probe output when switches 86 and 96 are opened to eliminate all system errors during normal operation.

As recalibration is necessary, probe 12 is oriented toward the reference distance and switches 86 and 96 are reclosed. The capacitor 84 will store whatever signal is provided by amplifier 82 to force the output of amplifier 70 to zero. The new compensating signal from amplifier 88 will continually thereafter provide the appropriate offset current to amplifier 70 to compensate for prior system errors.

It is to be noted that the reference signal from source 94 may conceptually be introduced into the feedback loop of amplifier 70 at other positions or deleted and that it is unnecessary, but convenient, that the amplifier 70 output be made zero at the reference distance.

Figure 4:
FIG. 4 is a schematic view of an alternative embodiment of the compensating signal generating means of the present invention.
Figure 4:
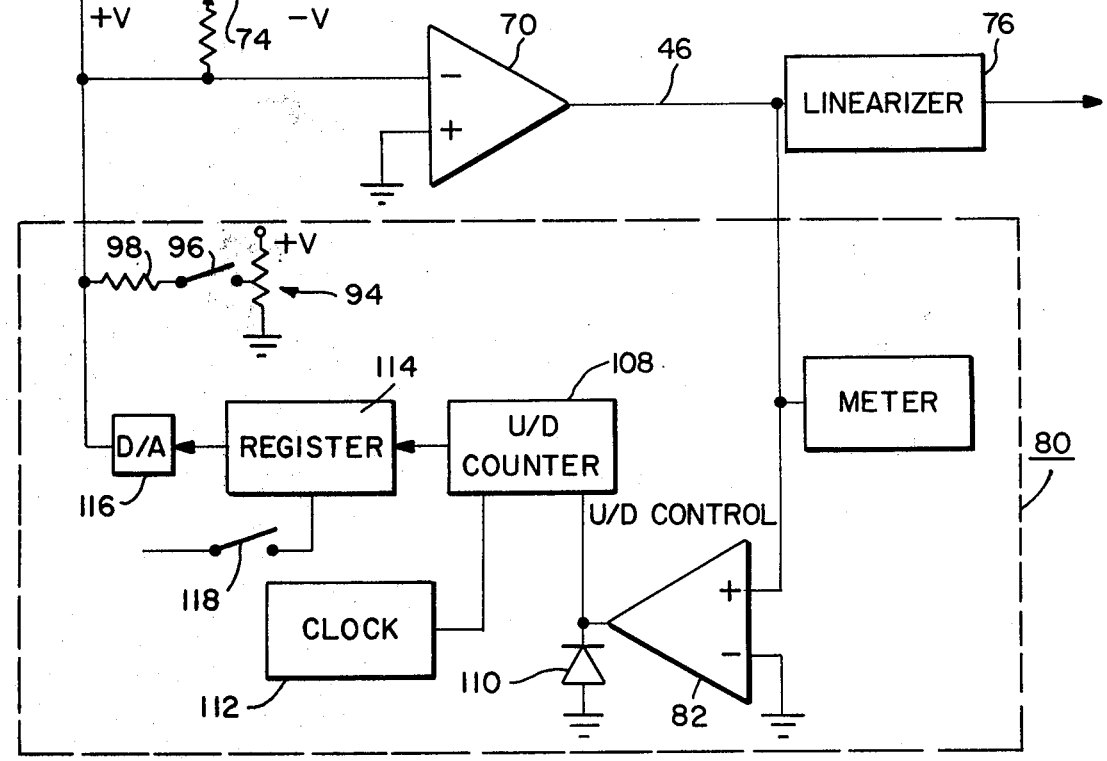

Referring now to FIG. 4, there is shown a schematic representation of the present invention whereby the feedback system 80 includes digital circuitry rather than the analog circuitry shown in FIG. 2.

The composite signal output of amplifier 70 is applied to differential amplifier 82 as in the previously described embodiment shown in FIG. 2. The output of differential amplifier 82 is applied to an up/down control input of an up/down digital counter 108. Diode 110 is provided on the output of amplifier 82 to clamp the output to the binary digital levels 0 and 1. A clock 112 applies clocking signals to the counter 108. The counter 108 output is applied to a digital register 114 whose output is applied to a digital-to-analog converter 116 to provide the compensation signal which is used as in the embodiment of FIG. 2. A strobe switch 118 permits the register 114 to accept and store the value of counter 108 in the same manner that switch 86 is used in the FIG. 2 embodiment.

While the dimension-gauging method and apparatus of the present invention have been described in preferred embodiments, it will be appreciated that variations and improvements in the implementation of the invention exist within its spirit and accordingly it is intended that the scope of the present invention be defined only in the following claims.

What is claimed is:

1. A system for compensating the output of a dimension gauging probe including:
a dimension gauging probe;
means for orienting said probe and having first and second states, the first state orienting said probe toward a work object and the second state orienting said probe toward a reference dimension;
means for energizing said probe to provide a probe output signal representative of a dimension gauged thereby;
means for varying the value of the probe output signal in response to a control signal;
means for developing said control signal to provide a predetermined value corresponding to said reference dimension in the varied probe output signal in the second state of said orienting means and for maintaining said control signal in the first state of said orienting means thereby to provide compensation in the varied probe output signal.

2. In a dimension-gauging system having a dimension-responsive probe which provides an output signal representative of a dimension within a range of dimensions related to a work object, the improvement for providing a compensation in the output signal for system errors comprising:
means responsive to said output signal and a compensation signal for providing a composite signal representative of the algebraic combination of said output signal with said compensation signal;
means for selectively orienting the probe to point toward or away from the work object, the orientation away from the work object corresponding to a gauged dimension of extreme size larger than any dimension within said range of dimensions;
means for providing a reference signal corresponding to the composite signal for a gauged dimension of said extreme size;
means responsive to the reference signal and the composite signal for providing a difference signal representing the greatly amplified difference between the reference signal and the composite signal;
storing means having first and second states and operative in the first state for generating a signal representative of the difference signal and in the second state for storing the signal representative of the difference signal when the probe is oriented away from the work object;
means responsive to the stored signal for providing said compensation signal;
means for providing an output indicative of dimension in response to said composite signal.

3. In a dimension-gauging system a dimension-gauging probe which provides an output signal representative of a dimension associated with a work object, the improvement for providing a compensation in the output signal for system errors comprising:
means for generating a reference signal;
a closed loop circuit including a negative feedback path for a feedback signal and having:
a first input responsive to the output signal of said probe and algebraically combining it with said feedback signal;
a second input responsive to said reference signal and algebraically combining it with said feedback signal;
means for selectively interrupting the feedback path;
means in the feedback path beyond said interrupting means for storing said feedback signal;
means fixturing said probe for orientation away from said work object to cause said dimension to greatly increase beyond the range of normally gauged dimensions and intended for operation to direct the probe away from the work object simultaneously with no interruption in the feedback path and to direct the probe toward said work object after interruption in the feedback path.

4. In a dimension-gauging system having a dimension-responsive probe which provides an output signal representative of a dimension associated with a work object, the improvement for providing a compensation in the output signal for system errors comprising:
means for selectively orienting the probe to point toward or away from the work object;
means responsive to the probe output signal and a compensation signal for providing a composite signal representative of the algebraic combination of said probe output signal and said compensation signal and indicative of the measured dimension;
means responsive to the composite signal for generating a signal representing the difference between said composite signal and a reference signal;
means intended for activation when the probe is oriented away from the work surface corresponding to a gauged dimension of virtual infinite size for storing the signal representative of the difference in an activated state thereof;
means responsive to the signal stored during activation of said storing means for generating said compensation signal.

5. The system according to claim 4 wherein the means responsive to the probe signal and compensation signal includes a summing amplifier.

6. The system according to claim 4 wherein said reference signal is at ground potential and a further reference signal is provided for application to the composite signal providing means to provide said composite signal at the level of the first-mentioned reference signal when said probe is oriented away from the work object.

7. The system according to claim 4 wherein the means for generating the difference signal includes a high gain differential amplifier.

8. The system according to claim 4 wherein the means for storing a signal representative of the difference signal includes a switch and a slowly discharging capacitor to which the difference signal is applied when the switch is in a first state and from which the difference signal is isolated when the switch is in a second state.

9. The system according to claim 4 wherein the means responsive to the signal stored during activation of said storing means includes an amplifier imparting to the storing means a time constant which is long compared to the time interval of intended use between calibrations for said system.

10. A method for providing error compensation in a dimension-gauging system having a dimension-responsive probe which provides an output signal representative of a dimension associated with a work object comprising the steps of:

combining said probe output signal with a compensation signal to provide a composite signal representative of the algebraic combination of said output signal and said compensation signal, developing the compensation signal from a signal stored in a storing means;

orienting the probe away from the work object toward a dimension of increased size;

storing a signal in said signal storing means representative of a signal amplitude which causes the composite signal to have a predetermined value for the dimension of increased size;

reorienting the probe toward the work object whereby dimension measurements may proceed with system errors corrected in the composite signal; and providing an output indicative of dimension in response to said composite signal.

11. The method of claim 10 wherein the step of storing a signal includes the steps of applying a reference signal in said composite signal to produce the predetermined value therefor.

12. A dimension-gauging system for use over a range of dimensions comprising:

a probe including:

a first electrode having a capacitance associated therewith which varies in response to the dimensions being gauged;

a second electrode having a capacitance associated therewith which is generally independent of the dimension being gauged;

means for applying electrical excitation to the first and second electrodes;

means responsive to the excitation applied to said first and second electrodes for providing an output signal representative of the difference in the capacitances associated with said first and second electrodes;

a third electrode positioned to increase the capacitance associated with said second electrode whereby said output signal has a zero signal level corresponding to a predetermined finite dimension; and compensation circuitry having:

means for selectively orienting said probe toward a reference dimension;

means for generating a compensation offset in said output signal; and means for establishing said compensation offset in said output signal when said probe is oriented toward said reference dimension to produce a predetermined signal level in the output signal.

* * * * *